(12) United States Patent
Kono et al.

(10) Patent No.: US 6,496,441 B2
(45) Date of Patent: Dec. 17, 2002

(54) SEMICONDUCTOR MEMORY DEVICE WITH IMPROVED DATA PROPAGATION CHARACTERISTICS OF A DATA BUS

(75) Inventors: Takashi Kono, Hyogo (JP); Tetsuo Kato, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/907,743

(22) Filed: Jul. 19, 2001

(65) Prior Publication Data

US 2002/0105849 A1 Aug. 8, 2002

(30) Foreign Application Priority Data

Feb. 6, 2001 (JP) ........................................ 2001-029215

(51) Int. Cl.[7] ................................................. G11C 8/00
(52) U.S. Cl. ............................. 365/230.03; 365/189.08
(58) Field of Search ............................. 365/230.03, 63, 365/189.08, 230.05

(56) References Cited

U.S. PATENT DOCUMENTS

| | | | |
|---|---|---|---|
| 5,966,316 A | 10/1999 | Tsukikawa | 365/51 |
| 6,064,621 A | 5/2000 | Tanizaki et al. | 365/230.03 |
| 6,072,743 A | 6/2000 | Amano et al. | 365/230.03 |

*Primary Examiner*—Richard Elms
*Assistant Examiner*—Hien Nguyen
(74) *Attorney, Agent, or Firm*—McDermott, Will & Emery

(57) ABSTRACT

By devising the arrangement of memory arrays surrounding the central region of the chip, the total length of a data bus can be reduced. The memory arrays are arranged such that one of two memory arrays that are located at the positions point-symmetric with respect to the central region corresponds to lower DQ terminals, and the other memory array corresponds to upper DQ terminals. Preferably, the memory arrays corresponding to the upper DQ terminals and the memory arrays corresponding to the lower DQ terminals are each located collectively. Thus, a semiconductor memory device with improved data propagation characteristics on the data bus can be provided.

12 Claims, 13 Drawing Sheets

SEMICONDUCTOR MEMORY DEVICE WITH IMPROVED DATA PROPAGATION CHARACTERISTICS OF A DATA BUS

BACKGROUND OF THE INVENTION

1. Field of the Invention

The present invention generally relates to a semiconductor memory device. More particularly, the present invention relates to a data bus structure of the semiconductor memory device having memory arrays arranged so as to surround a peripheral-circuit region located in the center of the chip.

2. Description of the Background Art

Conventionally, dynamic random access memories (DRAMs) including synchronous dynamic random access memories (SDRAMs) generally have a $2^n$-bit storage capacity. In order to realize this capacity, the memory arrays or banks of the DRAM are generally arranged in two by two, i.e., two rows by two columns.

Developing a new DRAM with a fourfold memory capacity in a 3-year cycle is the conventional trend. However, it is becoming technically difficult to improve the memory capacity as such. In the meantime, with expansion of the information and communication industry such as widespread use of the Internet, there is an active demand on the market for the improved memory capacity. In such circumstances, a DRAM having a $2^{(2n+1)}$-bit capacity has also been developed against the conventional trend. Such a DRAM may have an irregular memory-array arrangement instead of the conventional mainstream, i.e., the arrangement in two rows by two columns.

FIG. 14 is a diagram showing an example of the conventional irregular memory-array arrangement.

Referring to FIG. 14, a semiconductor memory device 500 includes four banks A to D. Each of the banks A, B, C and D is formed from a respective one of memory arrays AU, BU, CU and DU corresponding to upper data input/output (I/O) terminals UDQ and a respective one of memory arrays AL, BL, CL and DL corresponding to lower data I/O terminals LDQ. Each memory array has a 64-Mbit capacity, and each bank has a 128-Mbit capacity.

In other words, the banks A, B, C and D respectively include the memory arrays AU, BU, CU and DU corresponding to the upper data I/O terminals.

The banks A, B, C and D further includes the memory arrays AL, BL, CL and DL corresponding to the lower data I/O terminals, respectively.

Due to the shape of a memory cell unit, each memory array having a plurality of memory cells arranged in a matrix is sized to have a shorter side L and a longer side 2L. A column decoder band CPW is provided along one of the shorter sides of each memory array. Each column decoder band CPW includes preamplifiers and write drivers in addition to column decoders. A row decoder band RD is provided along one of the longer sides of each memory array.

The semiconductor memory device 500 is divided into nine regions of three rows by three columns. The memory arrays AL, DU and DL are respectively located in the regions of the first row, first column, the first row, second column, and the first row, third column. The memory arrays AU and CU are respectively located in the regions of the second row, first column, and the second row, third column. The memory arrays BL, BU and CL are respectively located in the regions of the third row, first column, the third row, second column, and the third row, third column.

The region of the second row, second column is the central region CEN. A plurality of pads PD and not-shown peripheral circuitry are provided in the central region CEN. The plurality of pads PD are divided into two pad trains, which are located in parallel with the longer side of the central region CEN. The first train located near the memory array DU includes the pads corresponding to the lower data I/O terminals LDQ. The second train located near the memory array BU includes the pads corresponding to the upper data I/O terminals UDQ.

Note that, in the case where the data I/O terminals for outputting and receiving the data receive 16-bit signals DQ0 to DQ15, the lower data I/O terminals LDQ respectively receive the signals DQ0 to DQ7, and the upper data I/O terminals UDQ respectively receive the signals DQ8 to DQ15.

An example of the simplest data bus structure corresponding to such a memory-array arrangement is shown in FIG. 14. An I/O line within a memory array and a data bus are connected to each other through the preamplifier and the write driver that are included in the corresponding column decoder band CPW provided along the shorter side of the memory array. Therefore, the data bus includes the portions located near the respective column decoder bands CPW and extending in parallel with the shorter side of the chip. These portions are connected to each other so as to allow for the data transmission between these portions and the data I/O terminals.

The total length of the data bus is not sufficiently considered in the conventional memory-array arrangement shown in FIG. 14. More specifically, the semiconductor memory device 500 having the three-row by three-column arrangement shown in FIG. 14 includes a data bus 502 for transmitting the data to the lower data I/O terminals LDQ and a data bus 504 for transmitting the data to the upper data I/O terminals UDQ.

In such a memory-array arrangement, the total length of the data bus 502 is about 8L, provided that the shorter side of the memory array is L. In this case, this data bus has the longest total length. This data bus itself has the largest load, which may significantly degrade the frequency characteristics in the read operation if the semiconductor memory device has short CAS latency in the data transmission. This may also increase the effective data write time, making it difficult to write the data to the memory array at a high speed.

As has been described above, in the irregular memory-array arrangement in which the memory arrays are arranged around the central region, the use of a simple memory-array arrangement or data bus structure is likely to make it difficult to satisfy a required specification.

SUMMARY OF THE INVENTION

It is an object of the present invention to provide a semiconductor memory device having a reduced load on a data bus and thus having improved operation frequency characteristics in the case where memory arrays are arranged so as to surround a peripheral-circuit region located in the center of the chip.

In summary, according to the present invention, a semiconductor memory device formed in a memory region of a main surface of a semiconductor substrate includes first and second input/output (I/O) terminal groups, a plurality of first memory blocks, a plurality of second memory blocks, a first data bus, and a second data bus.

The first and second I/O terminal groups are each located collectively in a central region of the memory region. The plurality of first memory blocks are provided in a peripheral region surrounding the central region, for receiving and outputting data from and to the first I/O terminal group. The plurality of second memory blocks are provided in the peripheral region, for receiving and outputting data from and to the second I/O terminal group. The plurality of second memory blocks are each located at a position symmetric to a position of the corresponding first memory block with respect to the central region, and are arranged so as to surround the central region together with the first memory blocks. The first data bus connects the first I/O terminal group to the plurality of first memory blocks. The second data bus connects the second I/O terminal group to the plurality of second memory blocks.

According to another aspect of the present invention, a semiconductor memory device formed in a memory region of a main surface of a semiconductor substrate includes first and second input/output (I/O) terminal groups, a plurality of first memory blocks, a plurality of second memory blocks, a first data bus, a second data bus, and a selection circuit.

The first and second I/O terminal groups are each located collectively in a central region of the memory region. The plurality of first memory blocks are provided in a peripheral region surrounding the central region, for receiving and outputting data from and to the first I/O terminal group. The plurality of second memory blocks are provided in the peripheral region, for receiving and outputting data from and to the second I/O terminal group. The plurality of second memory blocks are arranged so as to surround the central region together with the first memory blocks. The first data bus connects the first I/O terminal group to the plurality of first memory blocks. The second data bus connects the second I/O terminal group to the plurality of second memory blocks. The second data bus includes a first sub data bus for transmitting data to and from one of the plurality of second memory blocks, and a second sub data bus for transmitting data to and from another one of the plurality of second memory blocks. The selection circuit is provided in the central region, for selecting one of the first and second sub data buses according to an address signal so as to transmit data to and from the second I/O terminal group.

Accordingly, a main advantage of the present invention is that, in an irregular memory-array arrangement in which the memory arrays are arranged so as to surround the central region, the total length of the data bus can be reduced, allowing for high-speed data transmission.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
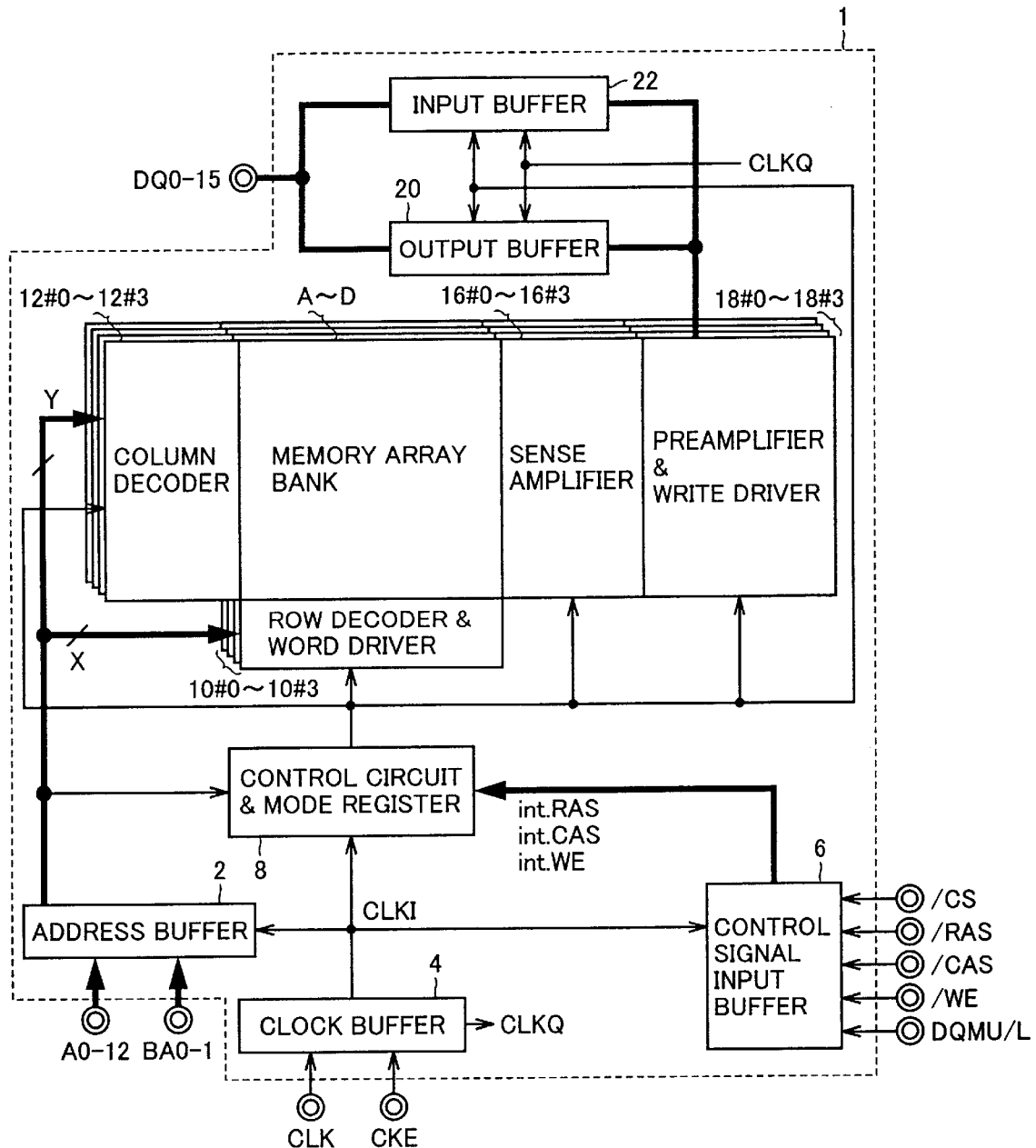
FIG. 1 is a schematic block diagram showing the structure of a semiconductor memory device 1 according to a first embodiment of the present invention.

Hereinafter, embodiments of the present invention will be described in detail with reference to the accompanying drawings. Note that the same reference numerals and characters denote the same or corresponding portions throughout the figures.

First Embodiment

FIG. 1 is a schematic block diagram showing the structure of a semiconductor memory device 1 according to a first embodiment of the present invention.

Referring to FIG. 1, the semiconductor memory device 1 includes memory array banks A to D each having a plurality of memory cells arranged in a matrix, an address buffer 2 for introducing therein external address signals A0 to A12 and external bank address signals BA0 and BA1 in synchronization with a clock signal CLKI and outputting an internal row address, an internal column address and an internal bank address, a clock buffer 4 for receiving an external clock signal CLK and an external clock enable signal CKE and outputting clock signals CLKI and CLKQ for use within the semiconductor memory device, and a control signal input buffer 6 for introducing therein external control signals /CS, /RAS, /CAS and /WE and an external mask signal DQMU/L in synchronization with the clock signal CLKI.

The semiconductor memory device 1 further includes a control circuit for receiving an internal address signal from the address buffer 2 and also receiving from the control signal input buffer 6 control signals int.RAS, int.CAS and int.WE synchronized with the clock signal, and outputting a control signal to each block in synchronization with the clock signal CLKI, and a mode register for retaining the operation mode recognized in the control circuit. In FIG. 1, the control circuit and the mode register are collectively shown as a single block 8.

The control circuit includes a bank address decoder for decoding internal bank address signals int.BA0 and int.BA1, and a command decoder for receiving the control signals int.RAS, int.CAS and int.WE for decoding.

The semiconductor memory device 1 further includes row decoders provided corresponding to the respective memory array banks A to D, for decoding a row address signal X applied from the address buffer 2, and word drivers provided corresponding to the respective memory array banks A to D, for driving an addressed row (word line) within the corresponding memory array bank A to D to the selected state according to an output signal of the corresponding row decoder. In FIG. 1, the row decoders and the word drivers are collectively shown as blocks 10#0 to 10#3.

The semiconductor memory device 1 further includes column decoders 12#0 to 12#3 for decoding an internal column address signal Y applied from the address buffer 2 to generate a column selection signal, and sense amplifiers 16#0 to 16#3 for sensing and amplifying the data in a memory cell connected to the selected row of the corresponding memory array bank A to D.

The semiconductor memory device 1 further includes an input buffer 22 for receiving external write data and producing internal write data, write drivers for amplifying the internal write data from the input buffer 22 for transmission to a selected memory cell, preamplifiers for amplifying the data read from the selected memory cell, and an output buffer 20 for buffering the data from the preamplifier for output to the outside.

The preamplifiers and the write drivers are provided respectively corresponding to the memory array banks A to D. In FIG. 1, the preamplifiers and the write drivers are collectively shown as blocks 18#0 to 18#3.

Note that the input buffer 22 and the output buffer 20 receive a clock signal CLKQ from the clock buffer 4, and receive and output the data from and to the outside through data I/O terminals DQ0 to DQ15 in synchronization with the clock signal CLKQ.

Figure 2:
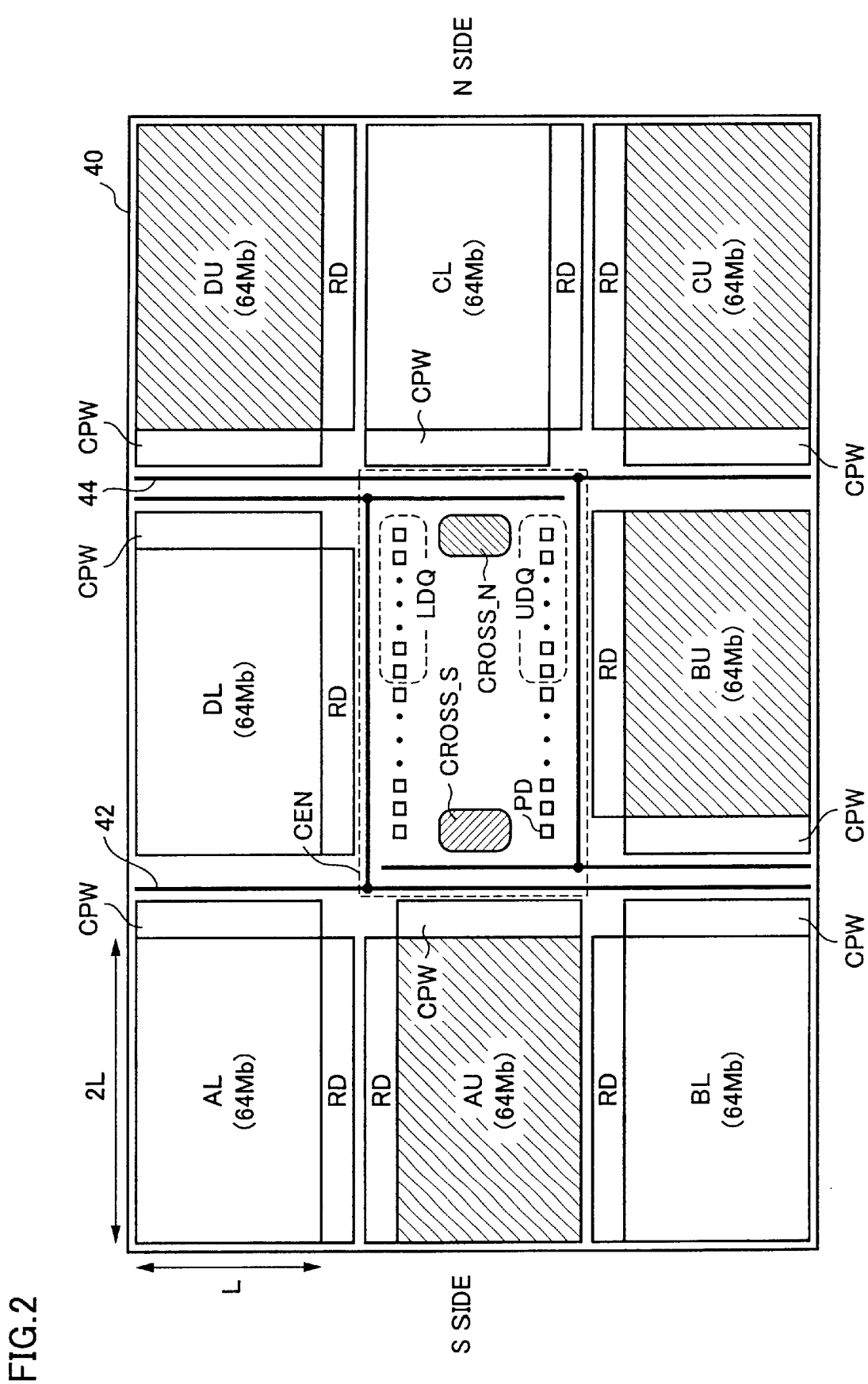
FIG. 2 is a diagram illustrating a semiconductor memory device 40 according to a first example of the memory array arrangement and the data bus arrangement of the first embodiment.

FIG. 2 is a diagram illustrating a semiconductor memory device 40 according to a first example of the memory-array arrangement and the data-bus arrangement of the first embodiment.

Referring to FIG. 2, the semiconductor memory device 40 is divided into nine regions of three rows by three columns. In FIG. 2, an irregular memory-array arrangement is employed. In other words, the memory arrays are located in the respective regions so as to surround the region located in the center of the nine regions, i.e., the region of the second row, second column.

The semiconductor memory device 40 includes four banks A to D. Each of the banks A, B, C and D is formed from a respective one of memory arrays AU, BU, CU and DU corresponding to upper data I/O terminals UDQ and a respective one of memory arrays AL, BL, CL and DL corresponding to lower data I/O terminals LDQ. Each memory array has a 64-Mbit capacity, and each bank has a 128-Mbit capacity.

In other words, the banks A, B, C and D respectively include the memory arrays AU, BU, CU and DU corresponding to the upper data I/O terminals.

The banks A, B, C and D further includes the memory arrays AL, BL, CL and DL corresponding to the lower data I/O terminals, respectively.

Due to the shape of a memory cell unit, each memory array having a plurality of memory cells arranged in a matrix is sized to have a shorter side L and a longer side 2L. A column decoder band CPW is provided along one of the shorter sides of each memory array. Each column decoder band CPW includes preamplifiers and write drivers in addition to column decoders. A row decoder band RD is provided along one of the longer sides of each memory array.

The memory arrays AL, DL and DU are respectively located in the regions of the first row, first column, the first row, second column, and the first row, third column. The memory arrays AU and CL are respectively located in the regions of the second row, first column, and the second row, third column. The memory arrays BL, BU and CU are respectively located in the regions of the third row, first column, the third row, second column, and the third row, third column.

The column decoder band CPW corresponding to the memory array AL is provided along the shorter side of the memory array AL that is located closer to the region of the first row, second column. The row decoder band RD corresponding to the memory array AL is provided along the longer side of the memory array AL that is located closer to the region of the second row, first column.

The column decoder band CPW corresponding to the memory array DL is provided along the shorter side of the memory array DL that is located closer to the region of the first row, third column. The row decoder band RD corresponding to the memory array DL is provided along the longer side of the memory array DL that is located closer to the region of the second row, second column.

The column decoder band CPW corresponding to the memory array DU is provided along the shorter side of the memory array DU that is located closer to the region of the first row, second column. The row decoder band RD corresponding to the memory array DU is provided along the longer side of the memory array DU that is located closer to the region of the second row, third column.

The column decoder band CPW corresponding to the memory array AU is provided along the shorter side of the memory array AU that is located closer to the region of the second row, second column. The row decoder band RD corresponding to the memory array AU is provided along the longer side of the memory array AU that is located closer to the region of the first row, first column.

The column decoder band CPW corresponding to the memory array CL is provided along the shorter side of the memory array CL that is located closer to the region of the second row, second column. The row decoder band RD corresponding to the memory array CL is provided along the longer side of the memory array CL that is located closer to the region of the third row, third column.

The column decoder band CPW corresponding to the memory array BL is provided along the shorter side of the memory array BL that is located closer to the region of the third row, second column. The row decoder band RD corresponding to the memory array BL is provided along the longer side of the memory array BL that is located closer to the region of the second row, first column.

The column decoder band CPW corresponding to the memory array BU is provided along the shorter side of the memory array BU that is located closer to the region of the third row, first column. The row decoder band RD corresponding to the memory array BU is provided along the longer side of the memory array BU that is located closer to the region of the second row, second column.

The column decoder band CPW corresponding to the memory array CU is provided along the shorter side of the memory array CU that is located closer to the region of the third row, second column. The row decoder band RD corresponding to the memory array CU is provided along the longer side of the memory array CU that is located closer to the region of the second row, third column.

The region of the second row, second column is the central region CEN. A plurality of pads PD and not-shown peripheral circuitry are provided in the central region CEN. The plurality of pads PD are divided into two pad trains, which are located in parallel with the longer side of the central region CEN. The first train located near the memory array DL includes the pads corresponding to the lower data I/O terminals LDQ. The second train located near the memory array BU includes the pads corresponding to the upper data I/O terminals UDQ.

Note that, in the case where the data I/O terminals for outputting and receiving the data receive, e.g., 16-bit signals DQ0 to DQ15, the lower data I/O terminals LDQ respectively receive the signals DQ0 to DQ7, and the upper data I/O terminals UDQ respectively receive the signals DQ8 to DQ15.

According to the arrangement shown in FIG. 2, the total length of the data bus can be reduced to a value smaller than 8L by devising the arrangement of the memory arrays of the banks.

For example, the memory arrays are arranged such that one of two memory arrays that are located at the positions point-symmetric with respect to the central region CEN of the semiconductor memory device 40 corresponds to the lower data I/O terminals LDQ, and the other memory array corresponds to the upper data I/O terminals UDQ.

More specifically, in FIG. 2, the memory array AL of the first row, first column corresponds to the lower data I/O terminals LDQ. The memory array CL of the third row, third column that is located at the position point-symmetric to the memory array AL with respect to the central region CEN corresponds to the upper data I/O terminals UDQ. The memory arrays DL, CL and BL corresponding to the lower data I/O terminals LDQ are respectively provided in the regions of the first row, second column, the second row, third column, and the third row, first column. The memory arrays BU, AU and DU corresponding to the upper data I/O terminals UDQ are respectively provided in the regions of the third row, second column, the second row, first column, and the first row, third column. These memory arrays BU, AU and DU are respectively located at the positions point-symmetric to the memory arrays DL, CL and BL with respect to the central region CEN. With such an arrangement, each of a lower data bus 42 and an upper data bus 44 has the total length of 7L.

According to the arrangement of FIG. 2, the memory arrays forming a bank are located adjacent to each other such that the respective row decoder bands RD face each other or the respective column decoder bands CPW face each other. This facilitates the layout of regions CROSS_S and CROSS_N where a circuit for generating a bank control signal is provided.

Note that the region CROSS_S corresponds to the banks A and B, and the region CROSS_N corresponds to the banks C and D. The signal line from the region CROSS_S, CROSS_N to each memory array is also facilitated.

Figure 3:
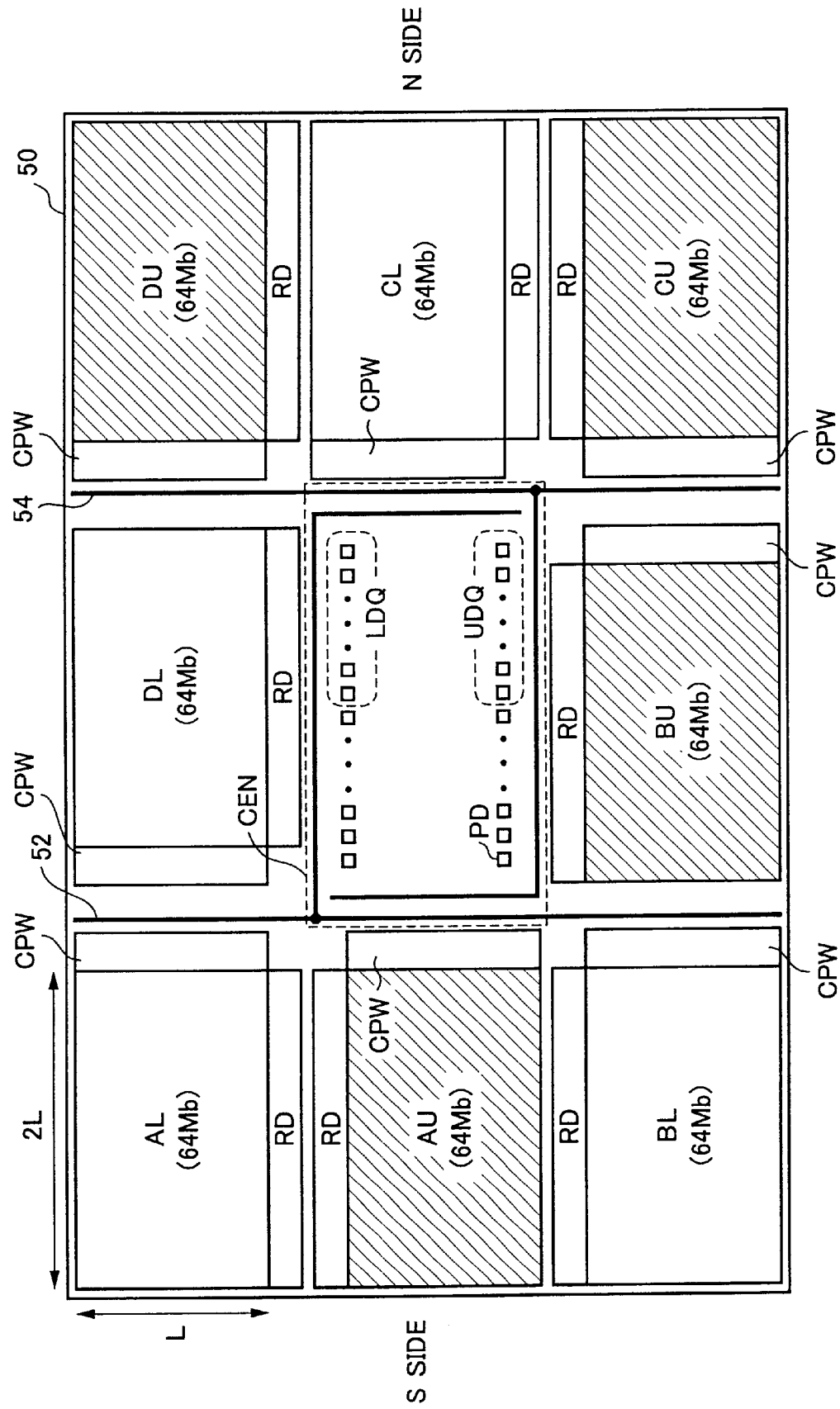
FIG. 3 is a diagram illustrating a semiconductor memory device 50 according to a second example of the memory array arrangement and the data bus arrangement of the first embodiment.

FIG. 3 is a diagram illustrating a semiconductor memory device 50 according to a second example of the memory-array arrangement and the data-bus arrangement of the first embodiment.

Referring to FIG. 3, the arrangement of the semiconductor memory device 50 is different from that of the semiconductor memory device 40 shown in FIG. 2 in that the column decoder band CPW corresponding to the memory array DL faces the memory array AL located in the region of the first row, first column, and in that the column decoder band CPW corresponding to the memory array BU faces the memory array CU located in the region of the third row, third column. Since the arrangement of the memory arrays, column decoder bands and row decoder bands is otherwise the same as that of FIG. 2, description thereof will not be repeated.

Unlike the data bus 42 of FIG. 2, the use of the arrangement shown in FIG. 3 eliminates the need for a lower data bus 52 to extend between the memory arrays DL and DU. Moreover, unlike the data bus 44 of FIG. 2, an upper data bus 54 need not extend between the memory arrays BL and BU. As a result, each of the data buses 52 and 54 has the total length of about 6L, allowing for higher-speed data transmission. In this case, however, it must be considered that the line load of a control signal is increased as compared to the case of FIG. 2 due to the separation between the column decoder bands CPW of the memory arrays BL and BU included in the bank B. The same applies to the bank D.

Figure 4:
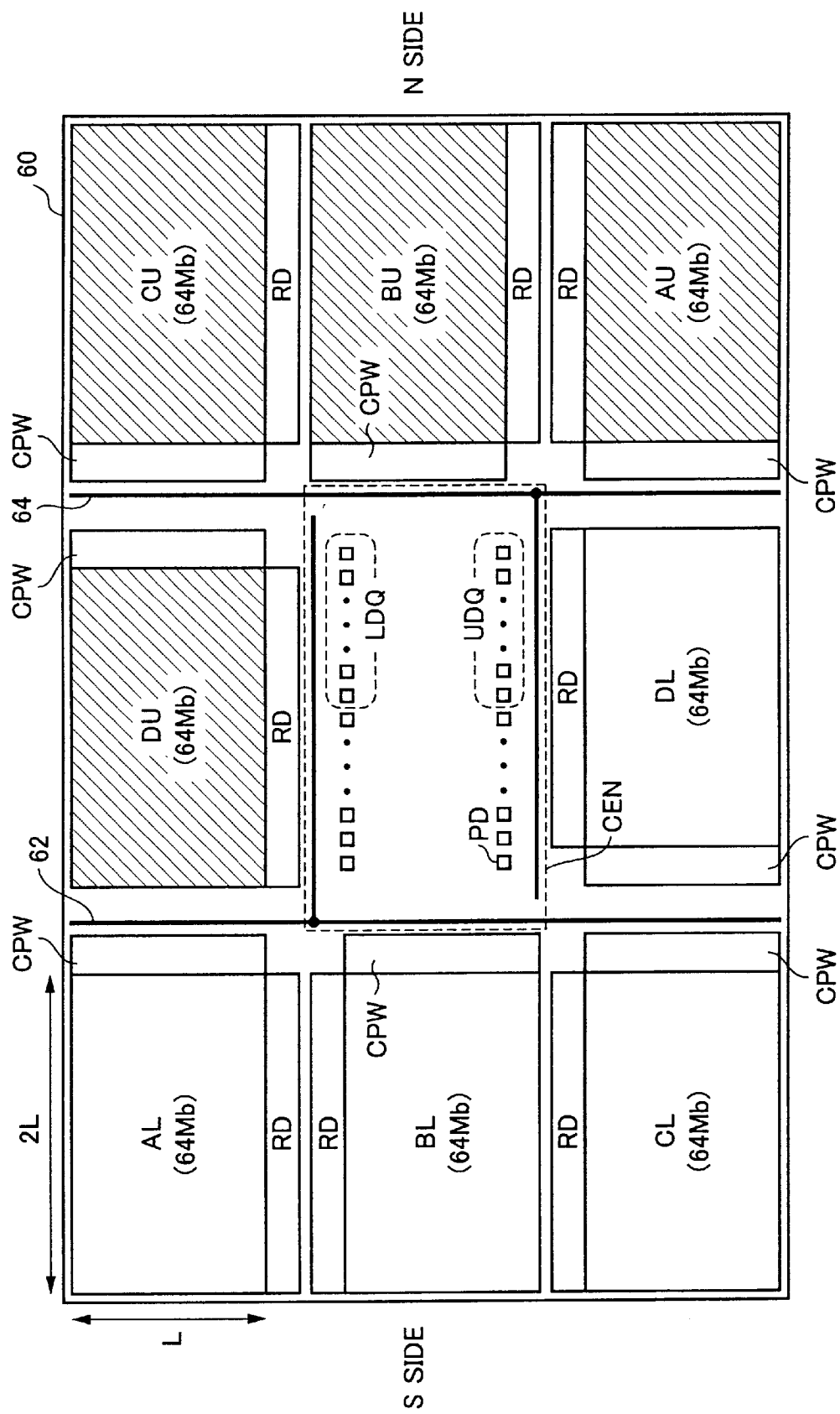
FIG. 4 is a diagram illustrating a semiconductor memory device 60 according to a third example of the memory array arrangement and the data bus arrangement of the first embodiment.

FIG. 4 is a diagram illustrating a semiconductor memory device 60 according to a third example of the memory-array arrangement and the data-bus arrangement of the first embodiment.

Referring to FIG. 4, in the semiconductor memory device 60, the memory arrays AU, BU, CU and DU corresponding to the upper data I/O terminals UDQ are collectively located. Similarly, the memory arrays AL, BL, CL and DL corresponding to the lower data I/O terminals LDQ are collectively located.

More specifically, the memory arrays AL, BL, CL and DL are respectively located in the regions of the first row, first column, the second row, first column, the third row, first column, and the third row, second column. The memory arrays AU, BU, CU and DU are respectively located in the regions of the third row, third column, the second row, third column, the first row, third column, and the first row, second column.

The row decoder band RD corresponding to the memory array AL is provided along the longer side of the memory array AL that is located closer to the region of the second row, first column. The column decoder band CPW corresponding to the memory array AL is provided along the shorter side of the memory array AL that is located closer to the region of the first row, second column.

The row decoder band RD corresponding to the memory array BL is provided along the longer side of the memory array BL that is located closer to the region of the first row, first column. The column decoder band CPW corresponding to the memory array BL is provided along the shorter side of the memory array BL that is located closer to the region of the second row, second column.

The row decoder band RD corresponding to the memory array CL is provided along the longer side of the memory array CL that is located closer to the region of the second row, first column. The column decoder band CPW corresponding to the memory array CL is provided along the shorter side of the memory array CL that is located closer to the region of the third row, second column.

The row decoder band RD corresponding to the memory array DL is provided along the longer side of the memory array DL that is located closer to the region of the second row, second column. The column decoder band CPW corresponding to the memory array DL is provided along the shorter side of the memory array DL that is located closer to the region of the third row, first column.

The row decoder band RD corresponding to the memory array AU is provided along the longer side of the memory array AU that is located closer to the region of the second row, third column. The column decoder band CPW corresponding to the memory array AU is provided along the shorter side of the memory array AU that is located closer to the region of the third row, second column.

The row decoder band RD corresponding to the memory array BU is provided along the longer side of the memory array BU that is located closer to the region of the third row, third column. The column decoder band CPW corresponding to the memory array BU is provided along the shorter side of the memory array BU that is located closer to the region of the second row, second column.

The row decoder band RD corresponding to the memory array CU is provided along the longer side of the memory array CU that is located closer to the region of the second row, third column. The column decoder band CPW corresponding to the memory array CU is provided along the shorter side of the memory array CU that is located closer to the region of the first row, second column.

The row decoder band RD corresponding to the memory array DU is provided along the longer side of the memory array DU that is located closer to the region of the second row, second column. The column decoder band CPW corresponding to the memory array DU is provided along the shorter side of the memory array DU that is located closer to the region of the first row, third column.

The use of the memory-array arrangement shown in FIG. 4 allows each of a lower data bus 62 and an upper data bus 64 to have the total length of 5L.

Figure 5:
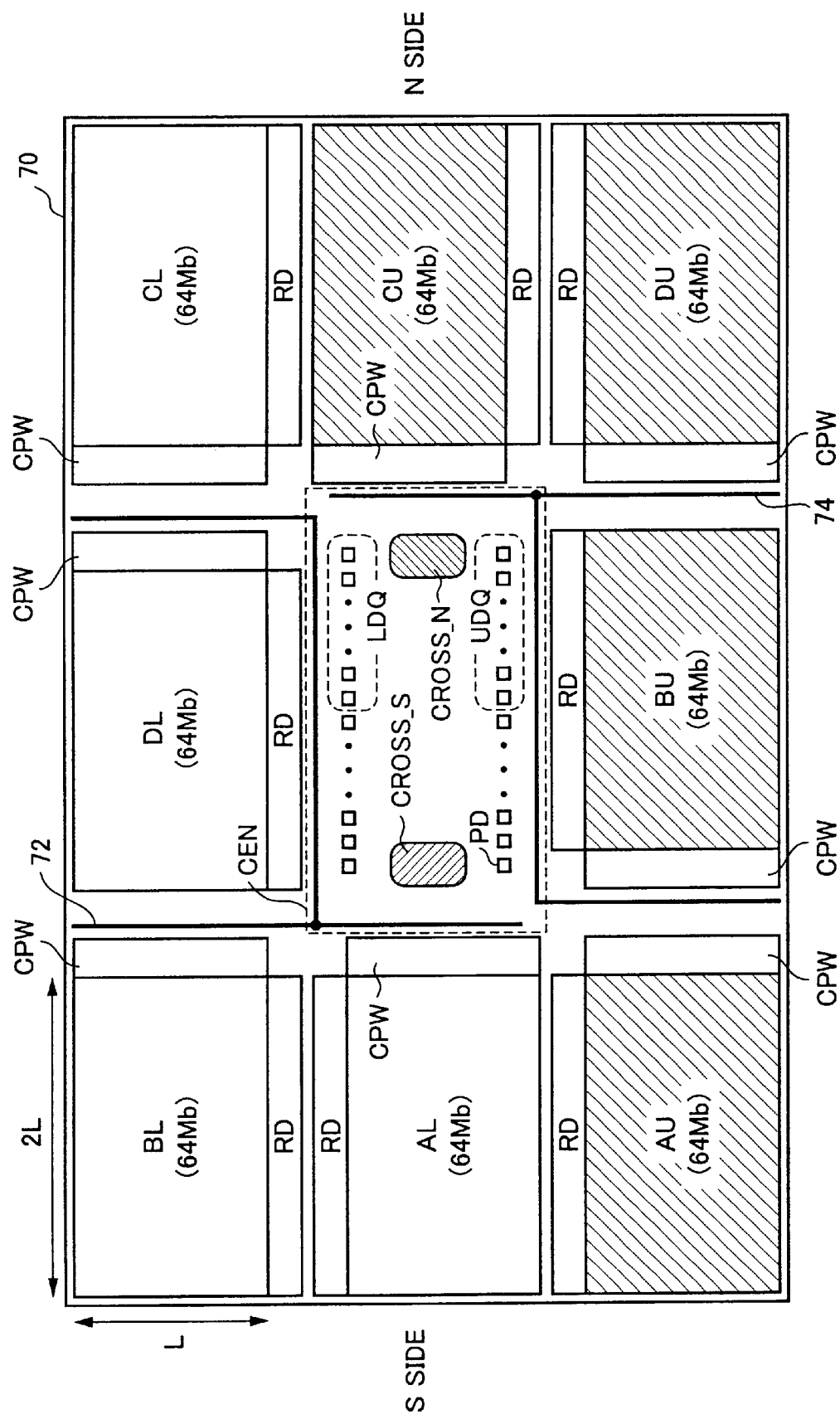
FIG. 5 is a diagram illustrating a semiconductor memory device 70 according to a fourth example of the memory array arrangement and the data bus arrangement of the first embodiment.

FIG. 5 is a diagram illustrating a semiconductor memory device 70 according to a fourth example of the memory-array arrangement and the data-bus arrangement of the first embodiment.

Referring to FIG. 5, in the semiconductor memory device 70, the memory arrays AU, BU, CU and DU corresponding to the upper data I/O terminals UDQ are collectively located, and the memory arrays AL, BL, CL and DL corresponding to the lower data I/O terminals LDQ are collectively located, as in the case of the semiconductor memory device 60 of FIG. 4.

More specifically, the memory arrays AL, BL, CL and DL are respectively located in the regions of the second row, first column, the first row, first column, the first row, third column, and the first row, second column. The memory arrays AU, BU, CU and DU are respectively located in the regions of the third row, first column, the third row, second column, the second row, third column, and the third row, third column.

The row decoder band RD corresponding to the memory array AL is provided along the longer side of the memory array AL that is located closer to the region of the first row, first column. The column decoder band CPW corresponding to the memory array AL is provided along the shorter side of the memory array AL that is located closer to the region of the second row, second column.

The row decoder band RD corresponding to the memory array BL is provided along the longer side of the memory array BL that is located closer to the region of the second row, first column. The column decoder band CPW corresponding to the memory array BL is provided along the shorter side of the memory array BL that is located closer to the region of the first row, second column.

The row decoder band RD corresponding to the memory array CL is provided along the longer side of the memory array CL that is located closer to the region of the second row, third column. The column decoder band CPW corresponding to the memory array CL is provided along the shorter side of the memory array CL that is located closer to the region of the first row, second column.

The row decoder band RD corresponding to the memory array DL is provided along the longer side of the memory array DL that is located closer to the region of the second row, second column. The column decoder band CPW corresponding to the memory array DL is provided along the shorter side of the memory array DL that is located closer to the region of the first row, third column.

The row decoder band RD corresponding to the memory array AU is provided along the longer side of the memory array AU that is located closer to the region of the first row, second column. The column decoder band CPW corresponding to the memory array AU is provided along the shorter side of the memory array AU that is located closer to the region of the third row, second column.

The row decoder band RD corresponding to the memory array BU is provided along the longer side of the memory array BU that is located closer to the region of the second row, second column. The column decoder band CPW corresponding to the memory array BU is provided along the shorter side of the memory array BU that is located closer to the region of the third row, first column.

The row decoder band RD corresponding to the memory array CU is provided along the longer side of the memory array CU that is located closer to the region of the third row, third column. The column decoder band CPW corresponding to the memory array CU is provided along the shorter side of the memory array CU that is located closer to the region of the second row, second column.

The row decoder band RD corresponding to the memory array DU is provided along the longer side of the memory array DU that is located closer to the region of the second row, third column. The column decoder band CPW corresponding to the memory array DU is provided along the shorter side of the memory array DU that is located closer to the region of the third row, second column.

As in the case of FIG. 4, the use of such a memory-array arrangement allows each of the data buses to have the total length of 5L.

The region CROSS_S is located near the memory arrays of the memory banks A and B. Similarly, the region CROSS_N is located near the memory arrays of the memory banks C and D. Accordingly, control circuits of the banks A and B can be collectively located in the region CROSS_S, and control circuits of the banks C and D can be collectively located in the region CROSS_N. The layout area of the components associated with the bank control including signal lines can be reduced as compared to the case of FIG. 4.

As has been described above, in the case where a single bank is formed from a plurality of memory arrays, the total length of the data bus can be reduced by devising the arrangement of the bank memory arrays. As a result, the data propagation characteristics on the data bus can be improved.

Second Embodiment

In the first embodiment, the memory-array arrangement is devised so as to reduce the total length of the data bus. As a result, the total length of the data bus can be reduced from 8L down to 5L at the maximum, allowing for improved data propagation characteristics on the data bus.

Figure 14:
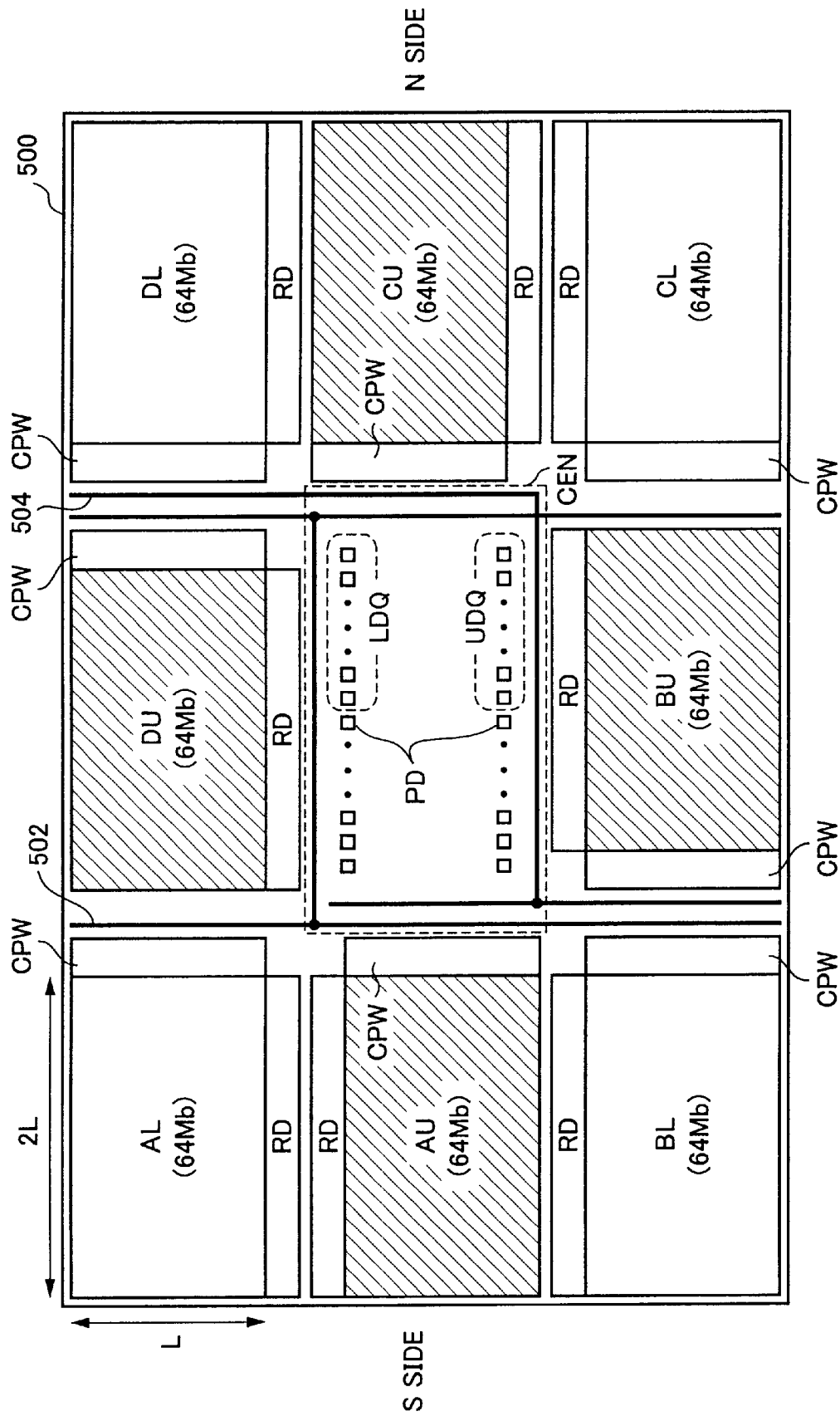
FIG. 14 is a diagram showing an example of the conventional irregular memory-array arrangement.

However, this memory-array arrangement is complicated as compared to the case of FIG. 14, which may possibly make the bank control difficult. Moreover, this memory-array arrangement cannot be applied to the case where a bank is formed from a single memory array.

Therefore, the structure capable of suppressing the total length of the data bus independently of the memory-array arrangement is considered. In the second embodiment, a data bus corresponding to certain data I/O terminals is divided into a plurality of sub data buses SDB within the chip, so that a sub data bus for data transmission is selected near the pad of the data I/O terminal.

Figure 6:
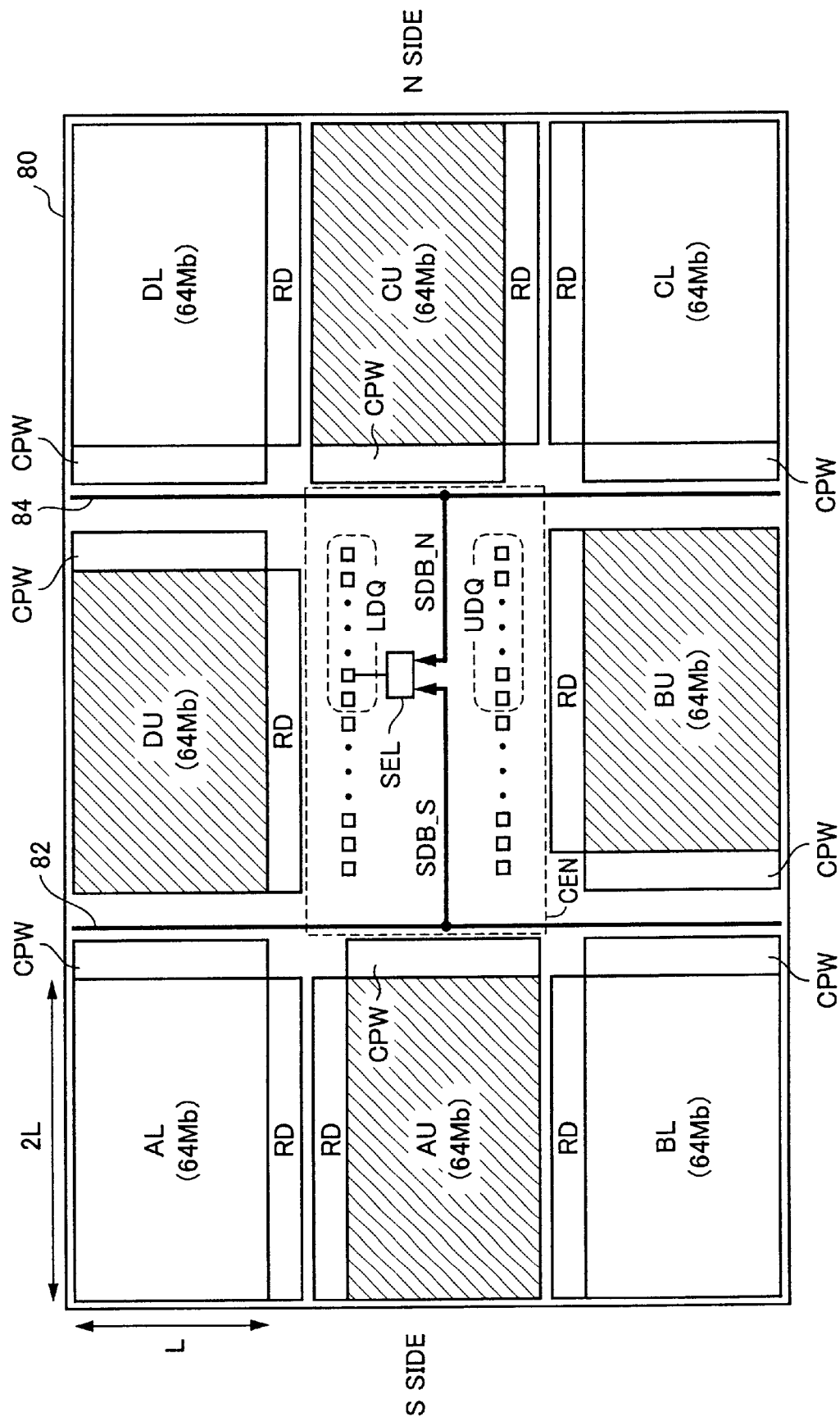
FIG. 6 is a diagram illustrating a semiconductor memory device 80 according to an exemplary data bus structure of a second embodiment.

FIG. 6 is a diagram illustrating a semiconductor memory device 80 according to an exemplary data bus structure of the second embodiment.

Referring to FIG. 6, the semiconductor memory device 80 is divided into nine regions of three rows by three columns. The memory arrays AL, DU and DL are respectively located in the regions of the first row, first column, the first row, second column, and the first row, third column. The memory arrays AU and CU are respectively located in the regions of the second row, first column and the second row, third column. The memory arrays BL, BU and CL are respectively located in the regions of the third row, first column, the third row, second column, and the third row, third column.

The region of the second row, second column is the central region CEN. A plurality of pads PD and not-shown peripheral circuitry are provided in the central region CEN. The plurality of pads PD are divided into two pad trains, which are located in parallel with the longer side of the central region CEN. The first train located near the memory array DU includes the pads corresponding to the lower data I/O terminals LDQ. The second train located near the memory array BU includes the pads corresponding to the upper data I/O terminals UDQ.

A selection circuit SEL for selecting one of two sub data buses SDB_S and SDB_N so as to receive and output the data from and to the corresponding data I/O terminal is provided near each data I/O terminal. FIG. 6 exemplarily shows only a single selection circuit SEL.

The row decoder band RD corresponding to the memory array AL is provided along the longer side of the memory array AL that is located closer to the region of the second row, first column. The column decoder band CPW corresponding to the memory array AL is provided along the shorter side of the memory array AL that is located closer to the region of the first row, second column.

The row decoder band RD corresponding to the memory array BL is provided along the longer side of the memory array BL that is located closer to the region of the second row, first column. The column decoder band CPW corresponding to the memory array BL is provided along the shorter side of the memory array BL that is located closer to the region of the third row, second column.

The row decoder band RD corresponding to the memory array CL is provided along the longer side of the memory array CL that is located closer to the region of the second row, third column. The column decoder band CPW corresponding to the memory array CL is provided along the shorter side of the memory array CL that is located closer to the region of the third row, second column.

The row decoder band RD corresponding to the memory array DL is provided along the longer side of the memory array DL that is located closer to the region of the second row, third column. The column decoder band CPW corresponding to the memory array DL is provided along the shorter side of the memory array DL that is located closer to the region of the first row, second column.

The row decoder band RD corresponding to the memory array AU is provided along the longer side of the memory array AU that is located closer to the region of the first row, first column. The column decoder band CPW corresponding to the memory array AU is provided along the shorter side of the memory array AU that is located closer to the region of the second row, second column.

The row decoder band RD corresponding to the memory array BU is provided along the longer side of the memory array BU that is located closer to the region of the second row, second column. The column decoder band CPW corresponding to the memory array BU is provided along the shorter side of the memory array BU that is located closer to the region of the third row, first column.

The row decoder band RD corresponding to the memory array CU is provided along the longer side of the memory array CU that is located closer to the region of the third row, third column. The column decoder band CPW corresponding to the memory array CU is provided along the shorter side of the memory array CU that is located closer to the region of the second row, second column.

The row decoder band RD corresponding to the memory array DU is provided along the longer side of the memory array DU that is located closer to the region of the second row, second column. The column decoder band CPW corresponding to the memory array DU is provided along the shorter side of the memory array DU that is located closer to the region of the first row, third column.

Herein, the shorter side of the chip that is located closer to the first column is referred to as "S side", and the shorter side of the chip that is located closer to the third column is referred to as "N side".

In FIG. 6, a sub data bus 82 corresponding to the S side and a sub data bus 84 corresponding to the N side are provided. The sub data bus 82 transmits the data between the memory bank A, B and the pad. The sub data bus 84 transmits the data between the memory bank C, D and the pad. The sub data bus 82 is connected to the sub data bus SDB_S at or around the middle point thereof. The sub data bus SDB_S transmits the data between the pad and the sub data bus 82. The sub data bus 84 is connected to the sub data bus SDB_N at or around the middle point thereof. The sub data bus SDB_N transmits the data between the pad and the sub data bus 84.

Note that the data bus structure of FIG. 6 exemplarily shows only the data bus corresponding to the lower data I/O terminals. The sub data buses SDB_S and SDB_N in the central region CEN extend through the region between the pad group corresponding to the terminals LDQ and the pad group corresponding to the terminals UDQ. However, the sub data buses SDB_S and SDB_N may alternatively extend through the region outside the pad groups.

In the arrangement of FIG. 6, the DQ pads are located closer to the N side with respect to the center of the chip. Therefore, the distance from the DQ pad to the memory array AL or BL through the sub data bus SDB_S and the sub data bus 82 determines the data propagation characteristics of the data bus. That distance is at most 5L.

Figure 7:
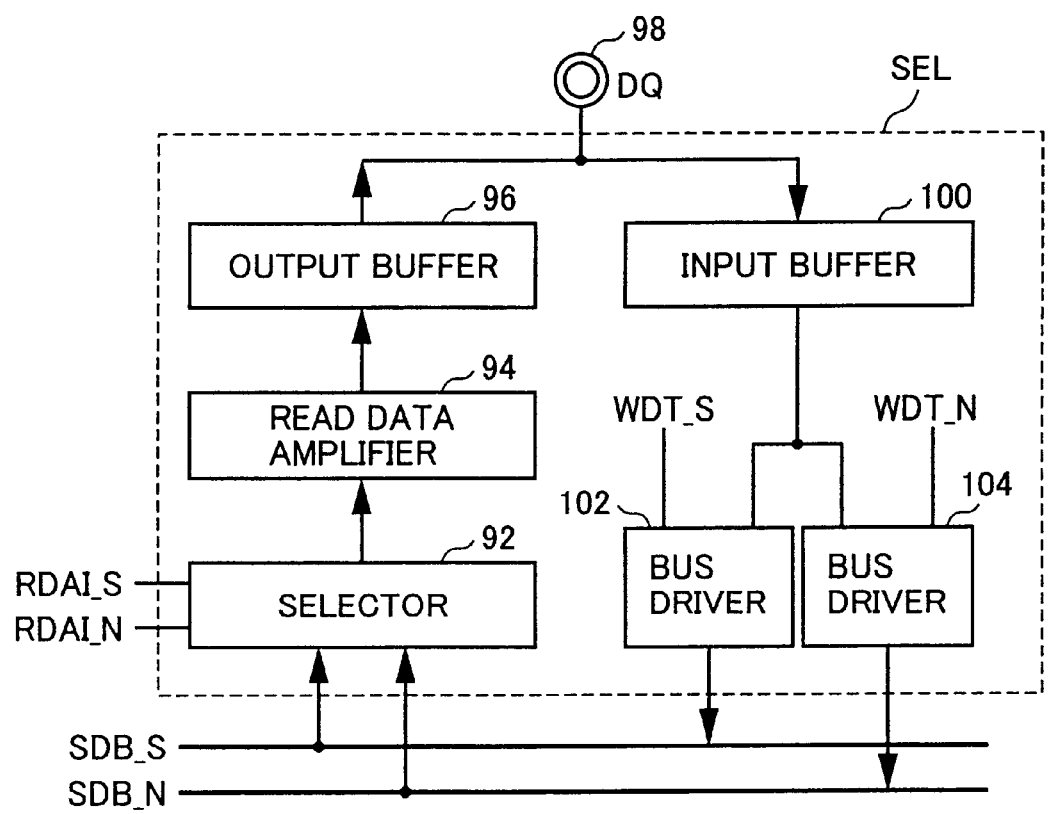
FIG. 7 is a block diagram showing the structure of a selection circuit SEL in FIG. 6.

FIG. 7 is a block diagram showing the structure of the selection circuit SEL in FIG. 6.

Referring to FIG. 7, the selection circuit SEL includes a selector 92 for selecting one of the respective read data applied from the sub data bus SDB_S and the sub data bus SDB_N according to control signals RDAI_S and RDAI_N, a read data amplifier 94 for amplifying the output of the selector 92, and an output buffer 96 for outputting the output of the read data amplifier 94 to a pad 98.

The selection circuit SEL further includes an input buffer 100 for receiving input data applied from the outside to the pad 98, a bus driver 102 for transmitting the output of the input buffer 100 to the sub data bus SDB_S in response to activation of a control signal WDT_S, and a bus driver 104 for outputting the output of the input buffer 100 to the sub data bus SDB_N in response to activation of the control signal WDT_N.

The control signal RDAI_S is activated when an external read command is applied and the bank A or B is designated.

The control signal RDAI_N is activated when an external read command is applied and the bank C or D is designated.

The control signal WDT_S, is activated when an external write command is applied and the bank A or B is designated. The control signal WDT_N is activated when an external write command is applied and the bank C or D is designated. Thus, one of the sub data buses SDB_S and SDB_N is selected with reference to the bank information attached to the external command.

The operation will now be described briefly. In the case where the read data is to be transmitted from the memory array to the selection circuit SEL, the control signal RDAI_S or RDAI_N is activated depending on whether that data is from the S side or N side.

In response to this, the selector 92 connects only one of the sub data buses to the read data amplifier.

On the contrary, in the case where the write data is to be written from the outside of the chip to the memory array through the pad 98, the control signal WDT_S, or WDT_N is activated according to the designated bank information. In response to this, either the bus driver 102 corresponding to the S side or the bus driver 104 corresponding to the N side is activated, whereby the data is transmitted to the appropriate sub data bus.

Figure 8:
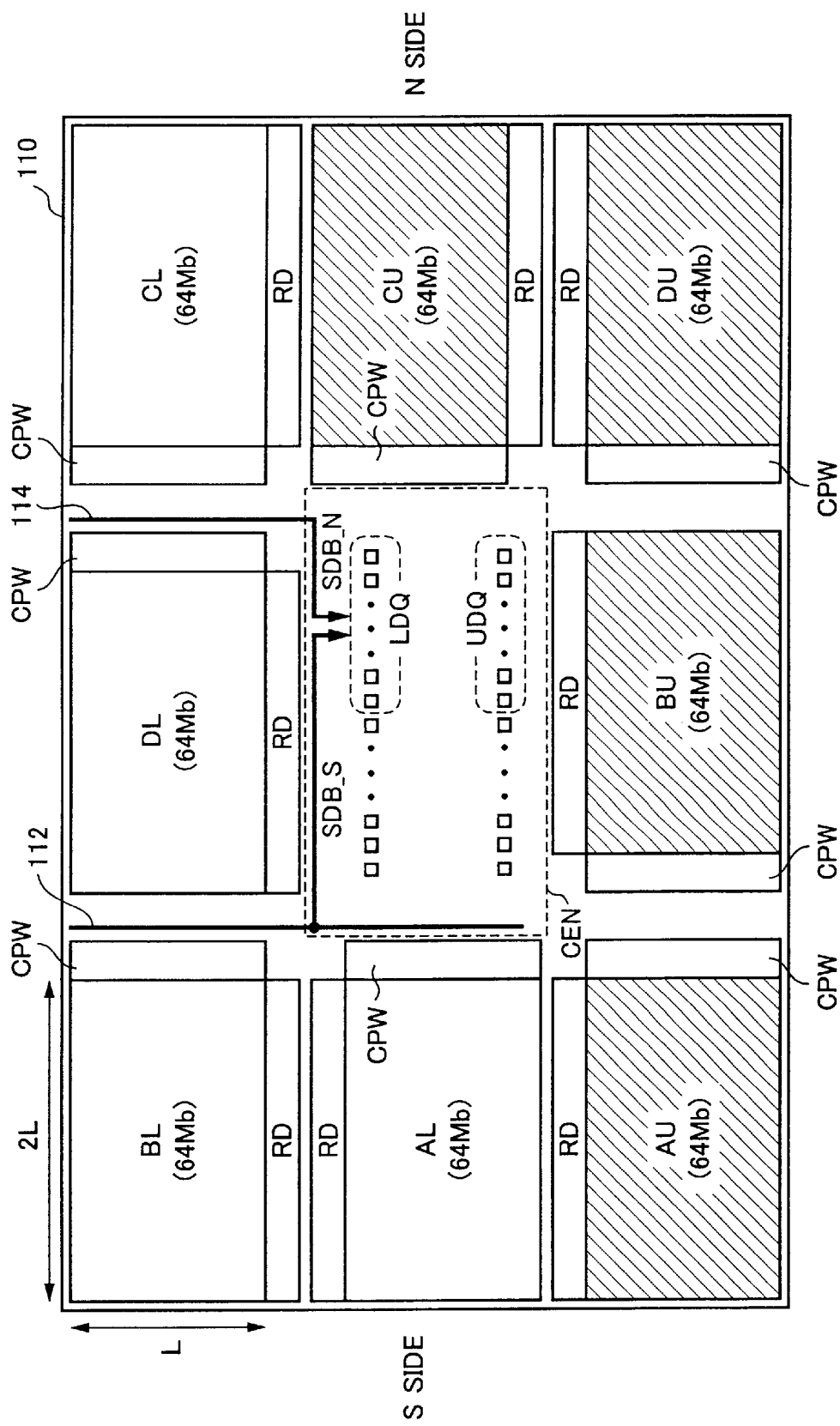
FIG. 8 is a diagram illustrating a semiconductor memory device 110 according to a modification of the data bus structure.

FIG. 8 is a diagram showing a semiconductor memory device 110 according to a modification of the data bus structure.

Referring to FIG. 8, the semiconductor memory device 110 employs the same memory-array arrangement as that of the semiconductor memory device 70 shown in FIG. 5. A sub data bus 112 for transmitting the data to the memory arrays BL and AL is connected to the sub data bus SDB_S at or around the middle point thereof. The sub data bus SDB_S transmits the data between the sub data bus 112 and the data I/O terminal LDQ. A sub data bus 114 for transmitting the data to the memory arrays DL and CL is connected to the sub data bus SDB_N. The sub data bus SDB_N transmits the data between the sub data bus 114 and the data I/O terminal LDQ.

Note that FIGS. 6 and 8 exemplarily shows only the data bus corresponding to the lower data I/O terminals LDQ. However, the same sub-data bus structure is used for the upper data I/O terminals UDQ.

More specifically, although not shown in the figure, in the arrangement of FIG. 6, a first sub data bus for transmitting the data to the memory arrays AU and BU extends along the sub data bus 82, and a second sub data bus for transmitting the data to the memory arrays DU and CU extends along the sub data bus 84. A selection circuit is provided for selecting one of these two sub data buses so as to receive and output the data from and to the corresponding upper data I/O terminal UDQ.

Similarly, although not shown in FIG. 8, a first sub data bus for transmitting the data to the memory arrays AU and BU and a second sub data bus for transmitting the data to the memory arrays DU and CU are provided. The use of the structure shown in FIG. 8 allows the maximum length of the sub data bus to be reduced to 4L.

As has been described above, in the second embodiment, a data bus corresponding to certain I/O terminals is formed from a plurality of sub data buses, and one of the sub data buses is selected by the selection circuit provided near the pad, so that the total length of the data bus can be suppressed. Accordingly, improved data propagation characteristics on the data bus are achieved. More preferably, further devising the memory-array arrangement allows for further reduction in the total length of the data bus.

Third Embodiment

In the second embodiment, the total length of the data bus is suppressed by using the sub-data bus structure. Another possible data bus structure having the same effects is a hierarchical structure.

Figure 9:
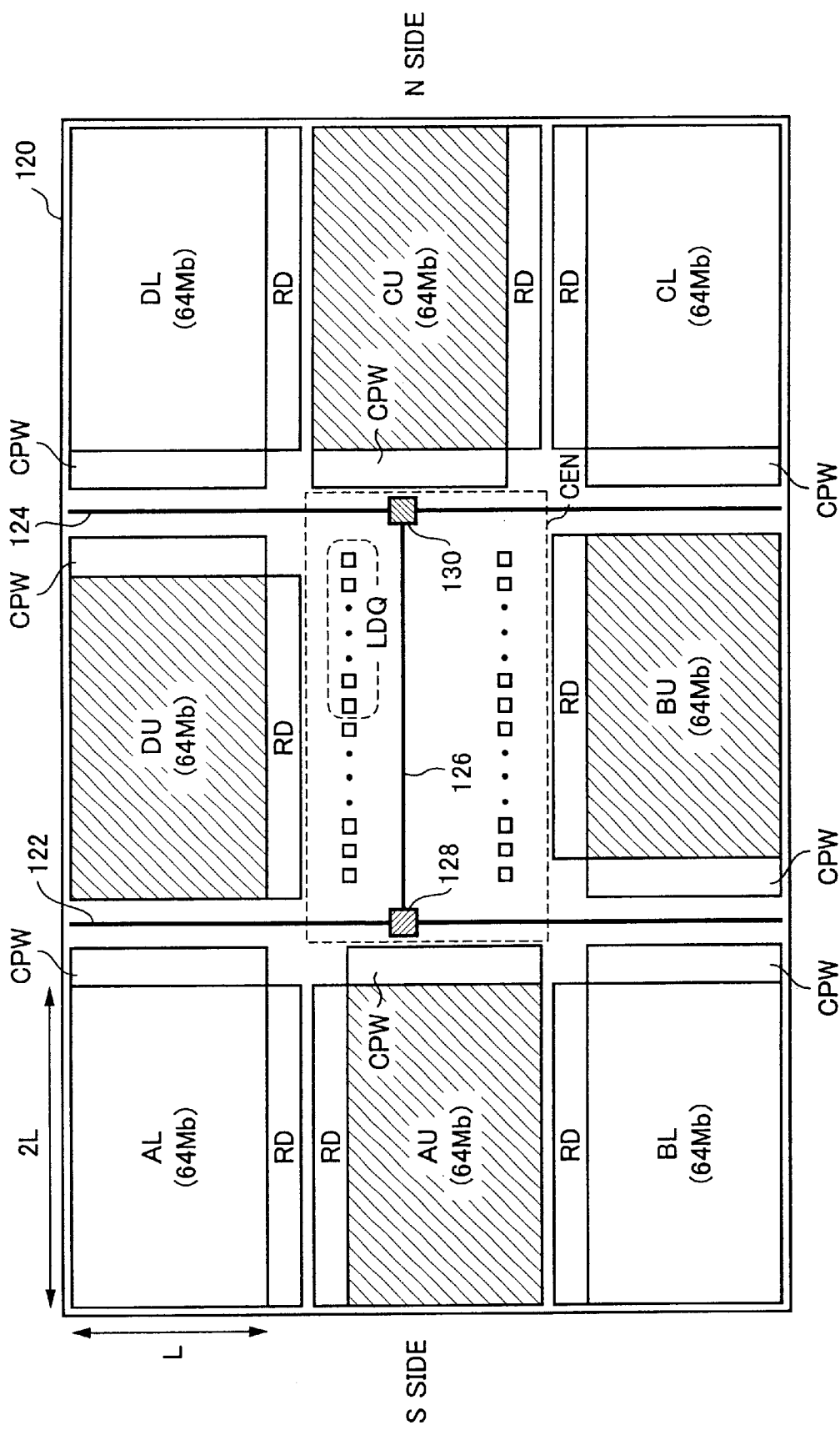
FIG. 9 is a diagram illustrating a semiconductor memory device 120 according to an exemplary data bus structure of a third embodiment.

FIG. 9 is a diagram illustrating a semiconductor memory device 120 according to an exemplary data bus structure of the third embodiment.

Referring to FIG. 9, in the semiconductor memory device 120, the memory arrays, column decoder bands CPW, and row decoder bands RD are arranged in the same manner as that of FIG. 6.

The semiconductor memory device 120 includes a main data bus 126 extending through the central region CEN from the S side toward the N side, a local data bus 122 for transmitting the data to the memory arrays AL and BL, and a local data bus 124 for transmitting the data to the memory arrays DL and CL.

The semiconductor memory device 120 further includes a switch 128 for connecting the main data bus 126 to the local data bus 122, and a switch 130 for connecting the main data bus 126 to the local data bus 124.

The switches 128, 130 and the main data bus perform the same function as that of the selection circuit SEL described in FIG. 7. In other words, like the sub data buses SDB_S and SDB_N of the second embodiment, connection control of the switches 128 and 130 is conducted with reference to the bank information attached to an external command.

In this data bus structure, the total length of the data bus is 5L, because the switch disconnects one of the local data buses 122 and 124.

Accordingly, although the load is increased due to the presence of the switches, the data propagation characteristics on the data bus is significantly improved over the data bus structure shown in FIG. 14. Moreover, the total length of the data bus is the same on the S side and N side, whereby arrangement of equalizing circuitry is simplified. Input/output (I/O) buffer circuitry provided near the pad is also simplified.

Figure 10:
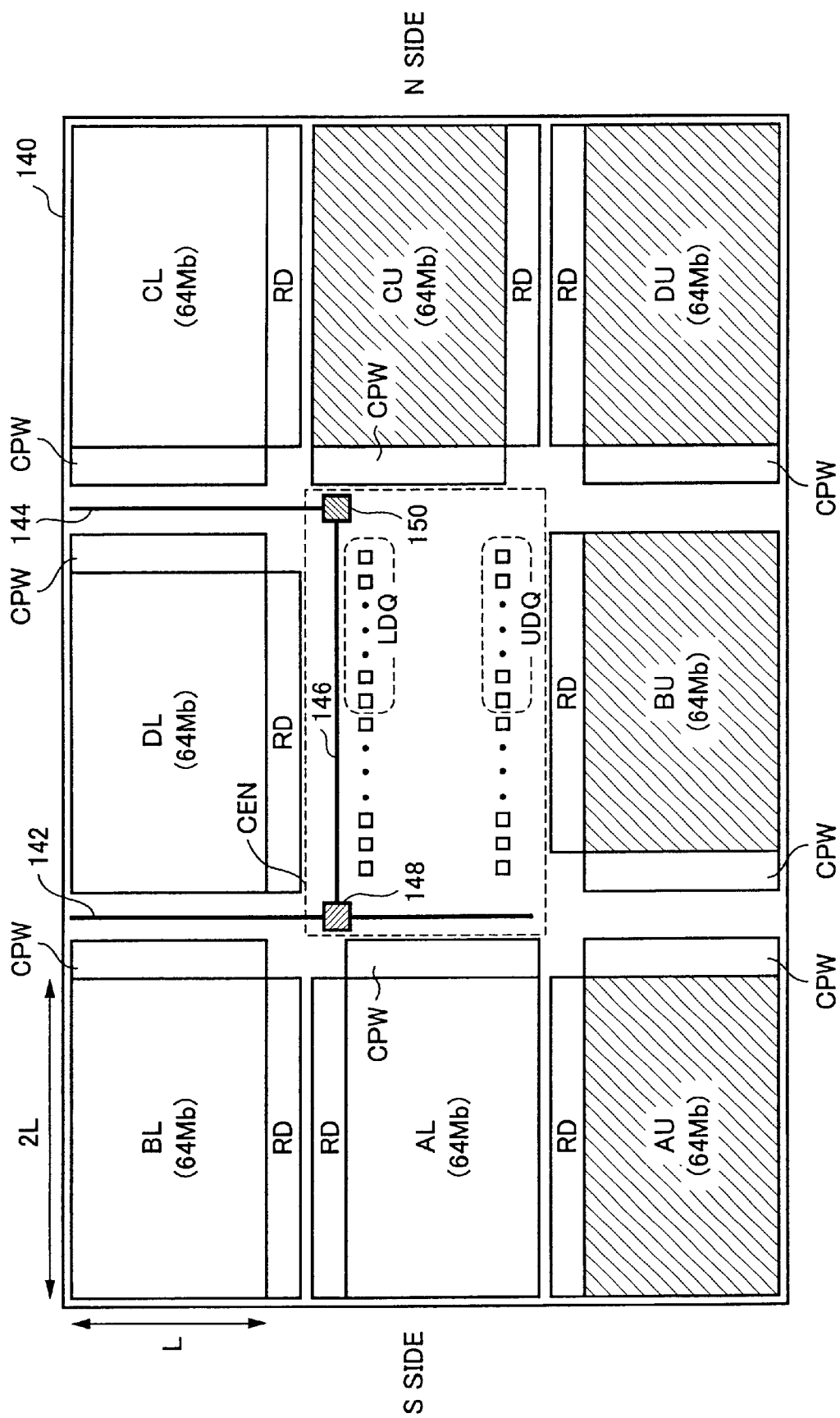
FIG. 10 is a diagram illustrating a semiconductor memory device 140 according to a modification of the data bus structure of the third embodiment.

FIG. 10 is a diagram showing a semiconductor memory device 140 according to a modification of the data bus structure of the third embodiment.

Referring to FIG. 10, on the semiconductor memory device 140, the memory arrays are arranged in the same manner as that of the semiconductor memory device 70 shown in FIG. 5. The row decoder bands RD and the column decoder bands CPW are also arranged in the same manner as that of FIG. 5.

The semiconductor memory device 140 includes a main data bus 146 corresponding to the lower data I/O terminals LDQ. The semiconductor memory device 140 further includes a local data bus 142 for transmitting the data to the memory arrays AL and BL, and a switch 148 for connecting the local data bus 142 to the main data bus 146.

The semiconductor memory device 140 further includes a local data bus 144 for transmitting the data to the memory arrays CL and DL, and a switch 150 for connecting the local data bus 144 to the main data bus 146.

The use of such a memory-array arrangement and hierarchical data bus structure as shown in FIG. 10 enables the total length of the local data bus and the main data bus to be reduced to 4L at the maximum.

Note that FIGS. 9 and 10 exemplarily shows only the data bus corresponding to the lower data I/O terminals LDQ. However, the same hierarchical data bus structure is used for the upper data I/O terminals UDQ.

In other words, although not shown in the figure, in the arrangement of FIG. 9, a first local data bus for transmitting the data to the memory arrays AU and BU extends along the local data bus 122, and a second local data bus for transmitting the data to the memory arrays DU and CU extends along the local data bus 124. In order to select one of these two local data buses for data transmission with the upper data I/O terminal UDQ, a main data bus connected to the upper data I/O terminals UDQ, and two switches respectively located at both ends of the main data bus are provided in the central region.

Similarly, although not shown in FIG. 10, a first local data bus for transmitting the data to the memory arrays AU and BU and a second local data bus for transmitting the data to the memory arrays DU and CU are provided. In order to select one of these two local data buses for data transmission with the upper data I/O terminal UDQ, a main data bus connected to the upper data I/O terminals UDQ, and two switches respectively located at both ends of the main data bus are provided in the central region.

As has been described above, according to the third embodiment, the use of the hierarchical data bus structure allows for reduction in the total length of the data bus as well as improvement in the data propagation characteristics on the data bus. Further devising the memory-array arrangement allows for further reduction in the total length of the data bus.

Fourth Embodiment

In the above embodiments, the memory arrays are arranged in the eight regions out of the nine regions of three rows by three columns. In terms of the layout, such an arrangement allows for a margin at least in the central region where the peripheral circuitry is provided. Accordingly, the line width and space between lines in the central region are less strictly limited by the design rules. Therefore, by changing the line width and space between lines of a part of the data bus, parasitic capacitance load and resistance load on the data bus can be reduced, allowing for improved data propagation characteristics on the data bus.

Figure 11:
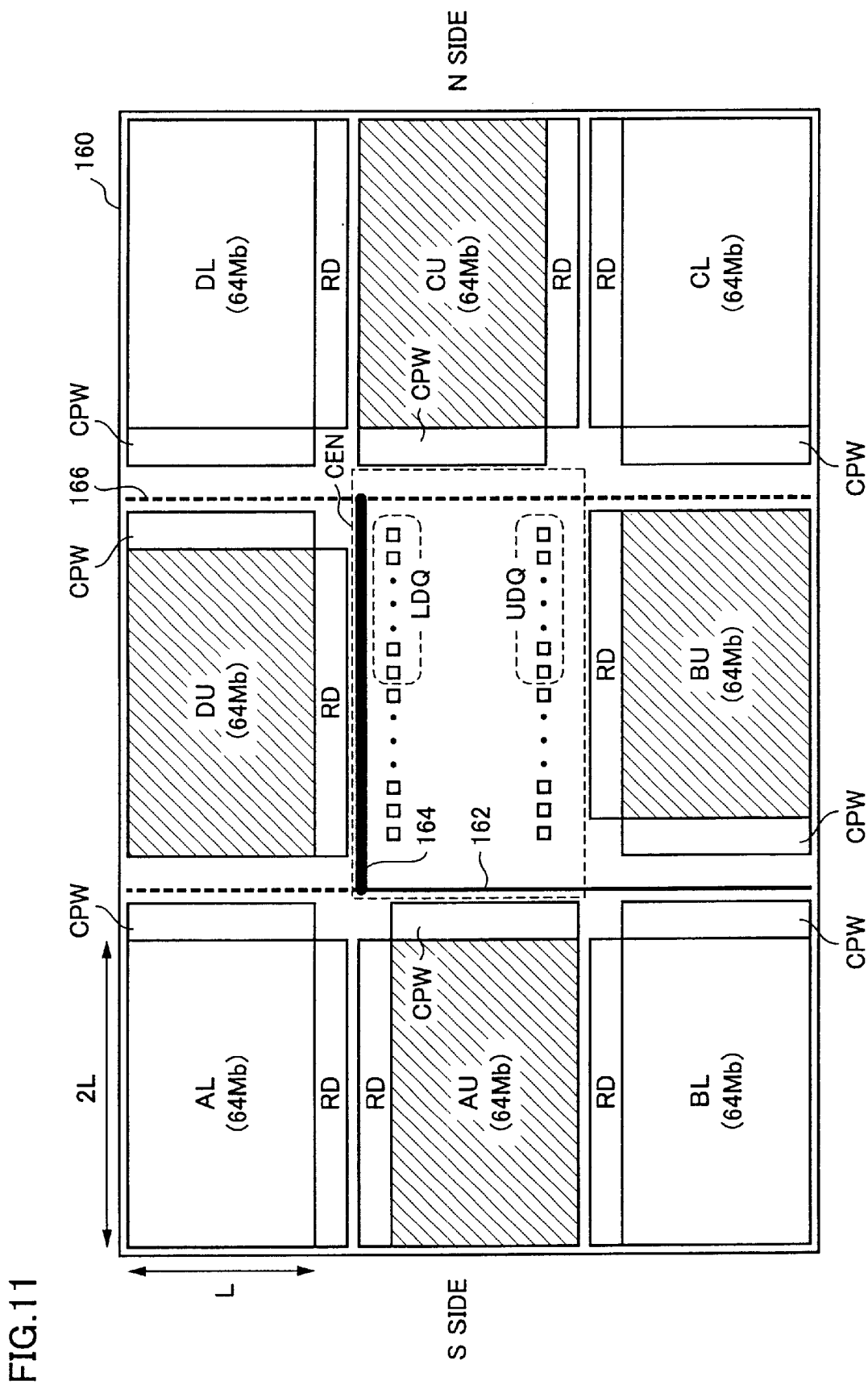
FIG. 11 is a diagram illustrating the data bus arrangement of a semiconductor memory device 160 according to a fourth embodiment.

FIG. 11 is a diagram illustrating the data bus arrangement of a semiconductor memory device according to the fourth embodiment.

Referring to FIG. 11, the memory arrays are arranged on the semiconductor memory device 160 in the same manner as that of FIG. 6. The row decoder bands RD and the column decoder bands CPW are also arranged in the same manner as that of FIG. 6.

FIG. 11 exemplarily shows only a data bus corresponding to the lower data I/O terminals LDQ. The data bus includes a portion 162 for transmitting the data to and from the memory arrays AL and BL, a portion 166 for transmitting the data to and from the memory arrays CL and DL, and a portion 164 connecting the portions 162 and 166 to each other, for transmitting the data to the terminal group LDQ. The path from the memory array BL to the terminal group LDQ is shown by the solid line. In such a data bus, the limitations on the line width and space between lines (line L and space S) are reduced in the portion 164 with respect to the other portions. The length of the portion 164 merely corresponds to a quarter of the total length of the data bus. However, this length corresponds to about a half of the maximum length 4L of the direct path from the memory array BL to the terminal LDQ. Therefore, the effect that can be actually expected is equal to or more than the improvement resulting from reducing the limitations on the line width and space between lines in the quarter of the total length.

Figure 12:
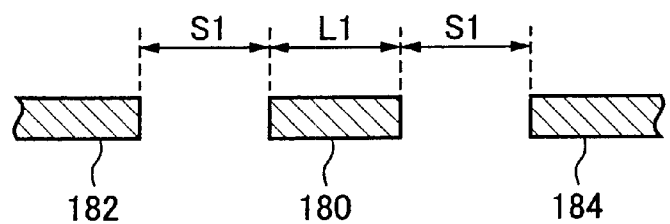
FIG. 12 is a cross-sectional view of a portion 162 of a data bus shown in FIG. 11.

FIG. 12 is a cross-sectional view of the portion 162 of the data bus shown in FIG. 11.

Figure 13:
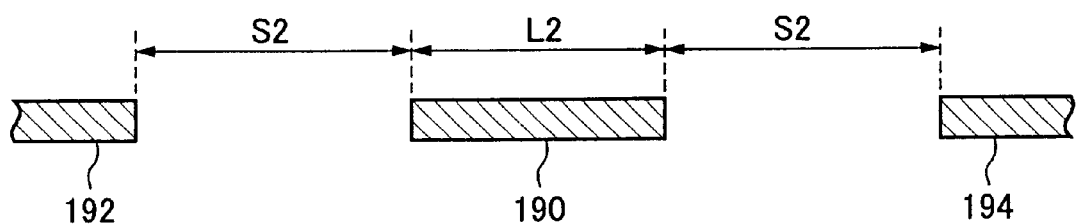
FIG. 13 is a cross-sectional view of a portion 164 of the data bus shown in FIG. 11.

FIG. 13 is a cross-sectional view of the portion 164 of the data bus shown in FIG. 11.

Referring to FIGS. 12 and 13, the width L2 of a data bus line 190 in the portion 164 is larger than the width L1 of a data bus line 180 in the portion 162. Accordingly, the line resistance is reduced, whereby the load of the data bus is also reduced. Provided that the distance between the data bus line 180 and adjacent lines 182 and 184 is S1, the distance S2 between the data bus line 190 and adjacent lines 192 and 194 is larger than S1. Accordingly, the parasitic capacitance on the data bus line can be reduced, whereby the load on the data bus line can also be reduced.

When there are not so strict limitations on the longer side of the chip, the limitations on the line width and space between lines may be reduced in the whole data bus shown in FIG. 11.

Note that reducing the limitations on the line width and space between lines of the entire data bus or a part of the data bus can also be applied to the data bus structures exemplified in the first to third embodiments. Combined with a reduced total length of the data bus, such reduction in the limitations on the line width and space between lines can significantly improve the data propagation characteristics on the data bus.

As has been described above, by reducing the limitations on the line width and space between lines of the entire data bus or a part of the data bus, the parasitic load on the data bus can be reduced, whereby the data propagation characteristics on the data bus can be improved.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device formed in a memory region of a main surface of a semiconductor substrate, comprising:

first and second input/output (I/O) terminal groups each provided in a central region of said memory region;

a plurality of first memory blocks provided in a peripheral region surrounding said central region, for receiving and outputting data from and to said first I/O terminal group;

a plurality of second memory blocks provided in said peripheral region, for receiving and outputting data from and to said second I/O terminal group, the plurality of second memory blocks each being located symmetrically to a corresponding one of said first memory blocks with respect to said central region, and also being arranged so as to surround said central region together with said first memory blocks;

a first data bus for connecting said first I/O terminal group to said plurality of first memory blocks; and a second data bus for connecting said second I/O terminal group to said plurality of second memory blocks.

2. The semiconductor memory device according to claim 1, wherein said peripheral region is divided into first and second regions, said plurality of first memory blocks are collectively located in said first region, and said plurality of second memory blocks are collectively located in said second region.

3. The semiconductor memory device according to claim 1, wherein said semiconductor memory device receives and outputs data of a plurality of bits from and to outside, the plurality of bits including a plurality of upper bits and a plurality of lower bits, said first I/O terminal group receives and outputs said plurality of upper bits, and said second I/O terminal group receives and outputs said plurality of lower bits.

4. The semiconductor memory device according to claim 1, wherein said memory region is divided into nine regions of three rows by three columns, said central region corresponds to a region of a second row, second column out of said nine regions, said peripheral region corresponds to eight regions out of said nine regions, said eight regions surrounding said region of the second row, second column, and a corresponding one of said plurality of first and second memory blocks is provided in each of said eight regions.

5. The semiconductor memory device according to claim 1, wherein said first data bus includes a portion of a data transmission line in said central region, said portion of said data transmission line having a larger width than that of said data transmission line in said peripheral region.

6. The semiconductor memory device according to claim 1, wherein said first data bus includes a portion of a data transmission line in said central region, said portion of said data transmission line having a larger space to an adjacent line than that of said data transmission line in said peripheral region.

7. A semiconductor memory device formed in a memory region of a main surface of a semiconductor substrate, comprising:

first and second input/output (I/O) terminal groups each provided in a central region of said memory region;

a plurality of first memory blocks provided in a peripheral region surrounding said central region, for receiving and outputting data from and to said first I/O terminal group;

a plurality of second memory blocks provided in said peripheral region, for receiving and outputting data from and to said second I/O terminal group, the plurality of second memory blocks being arranged so as to surround said central region together with said first memory blocks;

a first data bus for connecting said first I/O terminal group to said plurality of first memory blocks;

a second data bus for connecting said second I/O terminal group to said plurality of second memory blocks, said second data bus including a first sub data bus for transmitting data to and from one of said plurality of second memory blocks, and a second sub data bus for transmitting data to and from another one of said plurality of second memory blocks; and a selection circuit provided in said central region, for selecting one of said first and second sub data buses according to an address signal so as to transmit data to and from said second I/O terminal group.

8. The semiconductor memory device according to claim 7, wherein said selection circuit includes a selector for selecting one of said first and second sub data buses according to said address signal, a read data amplifier for amplifying read data received through the selector, an output buffer for outputting an output of said read data amplifier to said second I/O terminal group, an input buffer for receiving an external input data signal applied to said second I/O terminal group, and a bus driver for selecting one of said first and second sub data buses according to said address signal so as to drive the selected sub data bus according to an output of said input buffer.

9. The semiconductor memory device according to claim 7, wherein said selection circuit includes a main data bus for transmitting data to and from said second I/O terminal group, a first switch circuit for connecting said main data bus to said first sub data bus according to said address signal, and a second switch circuit for connecting said main data bus to said second data bus according to said address signal.

10. The semiconductor memory device according to claim 7, wherein said memory region is divided into nine regions of three rows by three columns, said central region corresponds to a region of a second row, second column out of said nine regions, said peripheral region corresponds to eight regions out of said nine regions, said eight regions surrounding said region of the second row, second column, and a corresponding one of said plurality of first and second memory blocks is provided in each of said eight regions.

11. The semiconductor memory device according to claim 7, wherein said first data bus includes a portion of a data transmission line in said central region, said portion of said data transmission line having a larger width than that of said data transmission line in said peripheral region.

12. The semiconductor memory device according to claim 7, wherein said first data bus includes a portion of a data transmission line in said central region, said portion of said data transmission line having a larger space to an adjacent line than that of said data transmission line in said peripheral region.

* * * * *